United States Patent
Lee et al.

(10) Patent No.: US 7,159,202 B2
(45) Date of Patent: Jan. 2, 2007

(54) METHODS, APPARATUS AND COMPUTER PROGRAM PRODUCTS FOR GENERATING SELECTIVE NETLISTS THAT INCLUDE INTERCONNECTION INFLUENCES AT PRE-LAYOUT AND POST-LAYOUT DESIGN STAGES

(75) Inventors: Jong-bae Lee, Kyungki-do (KR); Moon-hyun Yoo, Kyungki-do (KR); Kyo-sun Kim, Kyungki-do (KR); Jeong-min Choi, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 639 days.

(21) Appl. No.: 10/629,154

(22) Filed: Jul. 29, 2003

(65) Prior Publication Data
US 2004/0111688 A1 Jun. 10, 2004

(30) Foreign Application Priority Data
Dec. 4, 2002 (KR) .................. 10-2002-0076695

(51) Int. Cl.
*G06F 17/50* (2006.01)
(52) U.S. Cl. .................. 716/11; 716/18; 716/3; 716/5
(58) Field of Classification Search .......... 716/11, 716/18, 3, 5
See application file for complete search history.

(56) References Cited

U.S. PATENT DOCUMENTS

| | | | |
|---|---|---|---|
| 4,656,603 A * | 4/1987 | Dunn ...................... 715/835 |
| 5,894,420 A * | 4/1999 | Duncan ................... 716/12 |
| 6,009,252 A | 12/1999 | Lipton | |
| 6,131,182 A * | 10/2000 | Beakes et al. ............ 716/8 |
| 6,493,648 B1 * | 12/2002 | Anderson ................ 702/119 |
| 6,499,130 B1 | 12/2002 | Lipton et al. | |

(Continued)

OTHER PUBLICATIONS

Dent et al., "Comparison of VHDL/Synthesis and Graphical Methods for Top-Down Design", IEE Colloquium on Digital System Design Using Synthesis Techniques, Feb. 15, 1996, pp. 1/1-1/5.*

(Continued)

*Primary Examiner*—Phallaka Kik
(74) *Attorney, Agent, or Firm*—Myers Bigel Sibley & Sajovec PA

(57) ABSTRACT

Operations for generating an integrated circuit netlist include generating a first schematic of an integrated circuit having a plurality of cells therein and generating a second schematic that defines pre-layout electrical interconnects between the plurality of cells of the integrated circuit and approximates parasitic resistances and parasitic capacitances of the pre-layout interconnects. The first and second schematics are then combined at corresponding first and second ports within the first and second schematics, respectively. Operations also include generating an integrated circuit netlist by generating a circuit schematic that defines post-layout electrical interconnects between the plurality of cells of the integrated circuit and approximates parasitic resistances and parasitic capacitances of the post-layout interconnects. This circuit schematic is then combined with the first schematic at corresponding first and second ports therein. These embodiments may also be configured to generate a layout schematic from the first schematic of the integrated circuit and generate parasitic resistances and capacitances of the post-layout interconnects that extend between a plurality of cells in the layout schematic. Operations are then performed to generate parasitic resistances and capacitances of interconnects internal to at least one cell in the layout schematic.

10 Claims, 10 Drawing Sheets

U.S. PATENT DOCUMENTS

| | | |
|---|---|---|
| 6,505,323 B1 | 1/2003 | Lipton et al. |
| 6,507,932 B1 * | 1/2003 | Landry et al. ............... 716/3 |
| 6,675,118 B1 * | 1/2004 | Wanek et al. ............... 702/117 |
| 6,981,238 B1 * | 12/2005 | Churchill ............... 716/15 |
| 2004/0003356 A1 * | 1/2004 | Dewey et al. ............... 716/4 |

OTHER PUBLICATIONS

DeGrauwe et al., "The ADAM Analog Design Automation System", IEEE International Symposium on Circuits and Systems, May 1, 1990, vol. 2, pp. 820-822.*

* cited by examiner

▨ PI_M1
☐ PI_M2

```
R1  I1:y  A:1   10
R2  A:1   A:2   5
R3  A:1   I2:a  5
R4  A:2   A:3   15
R5  A:2   I3:b  10
R6  A:3   I4:a  5
C1  I1:y  VSS   0.1
C2  I2:a  VSS   0.1
C3  I3:b  VSS   0.2
C4  I4:a  VSS   0.3
C5  A:1   VSS   0.2
C6  A:2   VSS   0.2
C7  A:3   VSS   0.2
```

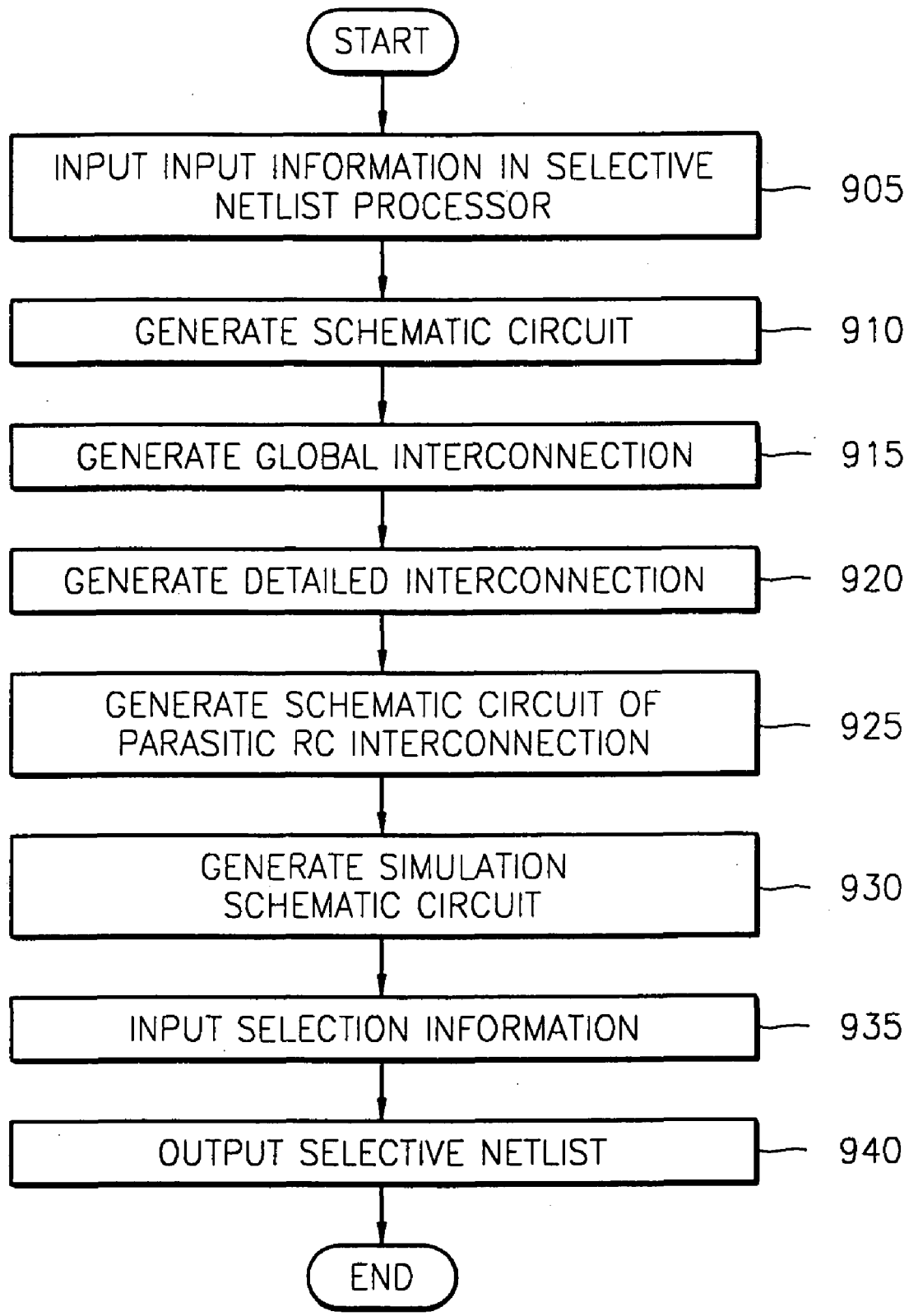

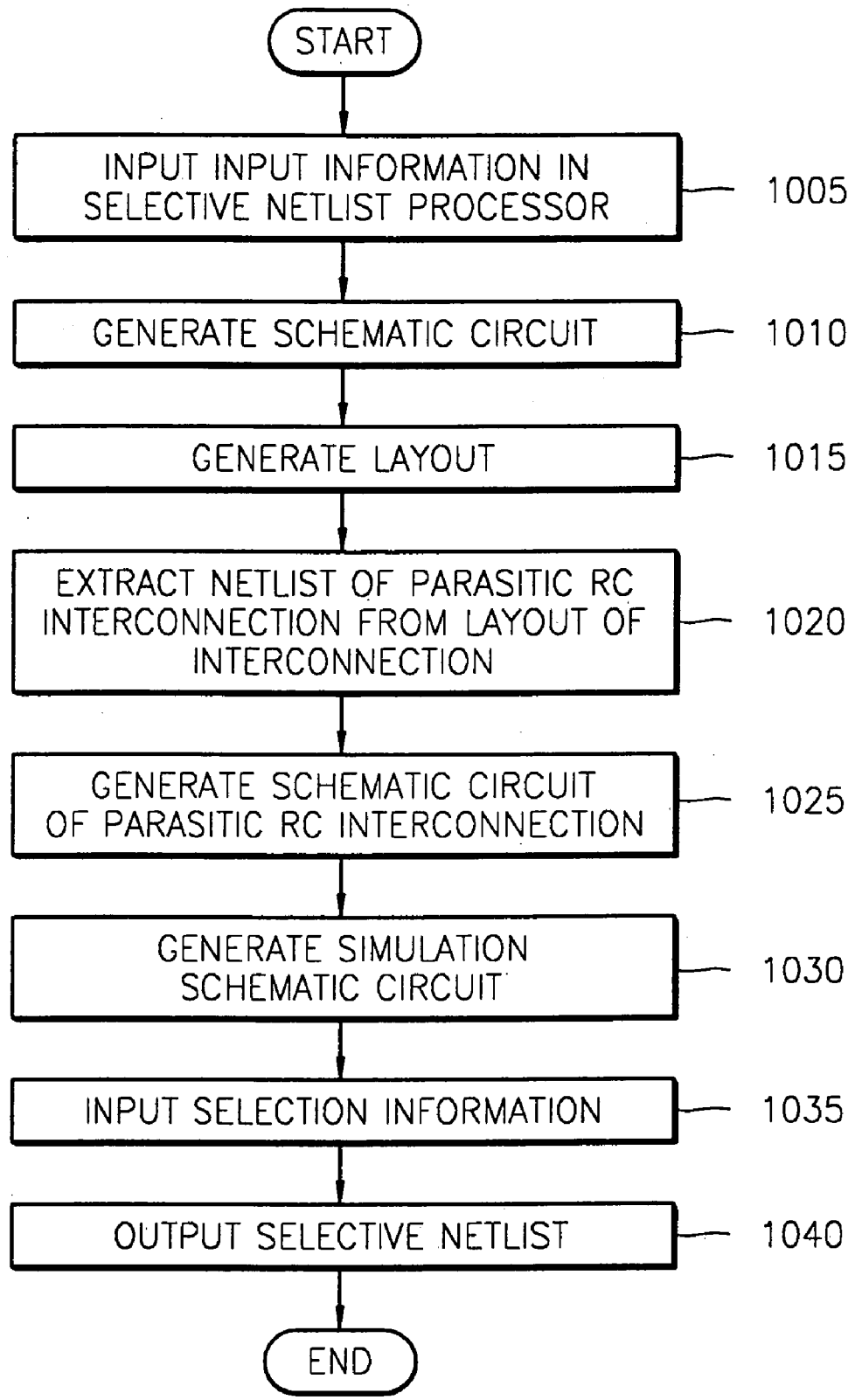

METHODS, APPARATUS AND COMPUTER PROGRAM PRODUCTS FOR GENERATING SELECTIVE NETLISTS THAT INCLUDE INTERCONNECTION INFLUENCES AT PRE-LAYOUT AND POST-LAYOUT DESIGN STAGES

RELATED APPLICATION

This application claims the priority of Korean Patent Application No. 2002-76695 filed on Dec. 4, 2002, in the Korean Intellectual Property Office, the disclosure of which is incorporated herein in its entirety by reference.

FIELD OF THE INVENTION

The present invention relates to circuit design units, and more particularly, to devices for generating integrated circuit netlists that support device simulation.

BACKGROUND OF THE INVENTION

In general, the design of semiconductor integrated circuits follows a set method. To begin with, a schematic circuit, which is a diagram showing connections between circuit devices, can be designed by a schematic tool. Next, the respective circuit devices included in the schematic circuit can be designed by patterns of such material layers as a conductive layer, a semiconductor layer, and an insulation layer. Then, a layout is designed where the respective patterns are disposed in vertical and horizontal directions, and the respective material layers are repeatedly deposited and patterned based on the layout. Thus, a semiconductor integrated circuit having a desired function can be manufactured.

When a schematic circuit of a semiconductor integrated circuit is drawn by a schematic tool, a netlist extracted from the schematic tool is simulated using a simulation device to inspect the operation of the semiconductor integrated circuit. If the results of the simulation are not satisfactory, the schematic circuit is modified. Here, the netlist is a file extracted from the schematic tool. This netlist is used for simulation or for layout versus schematic (LVS) comparison after the design of the semiconductor integrated circuit has been completed. The netlist represents connections between circuit devices included in the schematic circuit as well as connections between functional blocks (i.e., cells) formed of the circuit devices.

Conventionally, during a pre-layout stage of the design of the semiconductor integrated circuit, a conventional device did not include a design unit for automatically connecting cells on a schematic circuit to generate interconnections (or wires). For this reason, a designer had to predict the path of the interconnection and then directly input a schematic circuit of the interconnection using a schematic editor of a schematic tool. Thus, the designer could model only a part of the parasitic resistance and the parasitic capacitance of the interconnection, which greatly affect the performance of the semiconductor integrated circuit. As a result, the work of designing the parasitic resistance and parasitic capacitance of the interconnection increases design costs and design time. Also, when a floor plan, which is schematic layout information of a semiconductor integrated circuit, was changed, it was difficult to change the parasitic resistance and parasitic capacitance of the interconnection. Therefore, in the pre-layout stage, it was difficult to perform a simulation on the semiconductor integrated circuit, considering the parasitic resistance and parasitic capacitance of the interconnection.

Further, in a post-layout step of a semiconductor integrated circuit, when the semiconductor integrated circuit was simulated, a netlist file of an interconnection including parasitic resistance and parasitic capacitance, extracted from a layout of the semiconductor integrated circuit, was directly interfaced in a simulation device. Thus, when the semiconductor integrated circuit was simulated, errors such as a convergence error occurred often. Also, a lot of problems were caused when a control card was input or a probe sentence was inserted for analysis of the simulation results. Also, connections needed to be inconveniently tracked from the netlist having file formats other than the schematic circuit during the analysis of the simulation results.

There is at present a layout design unit (e.g., a CAD tool), which automatically extracts the critical path of the designed semiconductor integrated circuit and then provides a simulation device with a netlist on the critical path. A designer designates an input port and an output port of the critical path. But, as the netlist input to the simulation device has a particular file format, if a schematic circuit is changed, the foregoing simulation method using the layout design unit may become inconvenient. Also, since the critical path is automatically extracted based on input information such as the input port and output port, the critical path considered by the designer may not be defined. Besides, the simulation method is applied to the full-chip of the semiconductor integrated circuit, and this may require a large simulation time.

SUMMARY OF THE INVENTION

The present invention provides a selective netlist generation device for generating a netlist of a selected cell in a schematic circuit and a method therefor.

The present invention also provides a selective netlist generation device for generating a selective netlist including interconnection influence to be input in a simulation device using a schematic tool (or a selective netlist processor) in a pre-layout step, and a method therefor.

The present invention further provides a selective netlist generation device for generating a selective netlist including interconnection influence to be input in a simulation device using a schematic tool (or a selective netlist processor) in a post-layout step, and a method therefor.

The present invention still further provides a selective netlist generation device for generating a selective netlist including interconnection influence to be input in a simulation device using a schematic tool (or a selective netlist processor) in both a pre-layout step and a post-layout step.

In accordance with a first aspect of the present invention, there is provided a selective netlist generation device for generating a selective netlist, which is required to simulate a specific part of a semiconductor integrated circuit. The selective netlist generation device according to the present invention comprises a schematic circuit generation unit for generating a schematic circuit in response to input information including information on circuit devices included in respective cells, information on connections between the circuit devices, and schematic layout information of the cells, and a selective netlist output unit for selecting at least one cell included in the schematic circuit and generating a netlist of the selected cell, in response to selection information.

In accordance with a second aspect of the present invention, there is provided a selective netlist generation device for generating a selective netlist, which is required to simulate a specific part of a semiconductor integrated circuit. The selective netlist generation device according to one embodiment of the present invention includes a selective netlist processor for generating a selective netlist of a schematic circuit including cells, a simulation schematic circuit obtained by combining the schematic circuit and an interconnection schematic circuit, and cells performing specific operations of the simulation schematic circuit, in response to input information. This input information includes information on circuit devices included in the respective cells, information on connections between the circuit devices, and schematic layout information of the cells, information on interconnections interconnecting the cells, and selection information for selecting cells performing specific operations among the cells. The selective netlist generation device further includes an interconnection generator for generating interconnections in response to positional information of cells included in the schematic circuit and providing information on the generated interconnections to the selective netlist processor.

The selective netlist processor may include a schematic circuit generation unit for generating the schematic circuit in response to the input information; an interconnection schematic circuit generation unit for generating a schematic circuit of the interconnections in response to the information on the interconnections; a simulation schematic circuit generation unit for combining first ports included in the cells of the schematic circuit with second ports of the interconnection schematic circuit, corresponding to the first ports, to generate the simulation schematic circuit; and a selective netlist output unit for selecting cells performing specific operations of the simulation schematic circuit and generating a selective netlist of the selected cells.

The schematic circuit generated by the interconnection schematic circuit generating circuit should maintain positional relations between the cells and includes a hybrid π model. Moreover, the non-selected cells connected to the cells selected by the selection information via the interconnections are used as capacitance devices.

In accordance with a third aspect of the present invention, there is provided a selective netlist generation device for generating a selective netlist, which is required to simulate a specific part of a semiconductor integrated circuit. The selective netlist generation device includes a selective netlist processor for generating a selective netlist of a schematic circuit including cells, a simulation schematic circuit obtained by combining the schematic circuit and an interconnection schematic circuit, and cells performing specific operations of the simulation schematic circuit, in response to input information. The input information includes information on circuit devices included in the respective cells, information on connections between the circuit devices, and schematic layout information of the cells, a netlist of parasitic resistance and parasitic capacitance, which are parasitic on the layout of the interconnections interconnecting the cells, and selection information for selecting cells performing specific operations among the cells. The selective netlist generation device further includes a layout generator for generating a layout of the semiconductor integrated circuit in response to the information on the schematic circuit, provided from the selective netlist processor, and a parasitic RC extractor for extracting a netlist of the parasitic resistance and parasitic capacitance, which are parasitic on the layout of the interconnections, generated from the layout generator, and providing the extracted netlist to the selective netlist processor.

The selective netlist processor may also include a schematic circuit generation unit for generating the schematic circuit in response to the input information; an interconnection schematic circuit generation unit for generating the schematic circuit of the interconnections in response to the netlist of the parasitic resistance and parasitic capacitance; a simulation schematic circuit generation unit for combining first ports included in the cells of the schematic circuit and second ports of the interconnection schematic circuit corresponding to the first ports to generate the simulation schematic circuit; and a selective netlist output unit for selecting cells performing specific operations of the simulation schematic circuit and generating a selective netlist of the selected cells.

In accordance with a fourth aspect of the present invention, there is provided a selective netlist generation device for generating a selective netlist, which is required to simulate a specific part of a semiconductor integrated circuit. The selective netlist generation device may include a selective netlist processor for generating a selective netlist of a schematic circuit including cells, a first simulation schematic circuit obtained by combining the schematic circuit and an interconnection schematic circuit, a second simulation schematic circuit obtained by combining the schematic circuit and a schematic circuit corresponding to a netlist of parasitic resistance and parasitic capacitance, and cells performing specific operations of the simulation schematic circuit, in response to input information. The input information includes information on circuit devices included in the respective cells, information on connections between the circuit devices, schematic layout information of the cells, information on the interconnections interconnecting the cells, and selection information for selecting cells performing specific operations among the cells. The selective netlist generation device further includes an interconnection generator for generating the interconnections in response to positional information of the cells and providing the generated information on the interconnections. A layout generator is also provided. The layout generator is configured to generate a layout generator for generating a layout of the semiconductor integrated circuit in response to the information on the schematic circuit provided from the selective netlist processor. A parasitic RC extractor may also be provided. The parasitic RC extractor extracts a netlist of the parasitic resistance and parasitic capacitance, which is parasitic on the layout of the interconnections, generated from the layout generator, and provides the extracted netlist to the selective netlist processor.

The selective netlist generation device may combine the selective netlist of the parasitic resistance and parasitic capacitance, which are parasitic on the layout of the cells extracted by the parasitic RC extractor, with the selective netlist of the selected cells, to generate a combined selective netlist.

In some further embodiments of the present invention, cells and interconnections for analyzing specific operations can be selected in the simulation schematic circuit including the parasitic resistance and parasitic capacitance of the interconnections. Accordingly, various simulations can be analyzed quite accurately, and the time required for the simulation of a semiconductor integrated circuit can be effectively reduced. Also, in the selective netlist generation device and the method therefor according to the present invention, the parasitic RC interconnections generated in a pre-layout step or in a post-layout step are generated as the schematic circuit and then interfaced in a simulation device. As a result, as compared to the case that the netlist of the parasitic RC interconnection is interfaced as a file in the simulation device, errors caused by the designer can be reduced. Also, the present invention allows the designer to accurately analyze modeling of the parasitic resistance and parasitic capacitance. Further, it becomes easier for the designer to insert a variety of simulation options into the schematic circuit.

BRIEF DESCRIPTION OF THE DRAWINGS

The above and other features and advantages of the present invention will become more apparent by describing in detail exemplary embodiments thereof with reference to the attached drawings in which:

FIG. 9 is a flowchart illustrating a method for generating a selective netlist according to another embodiment of the present invention; and FIG. 10 is a flowchart illustrating a method for generating a selective netlist according to an embodiment of the present invention.

DETAILED DESCRIPTION OF THE INVENTION

Figure 1:
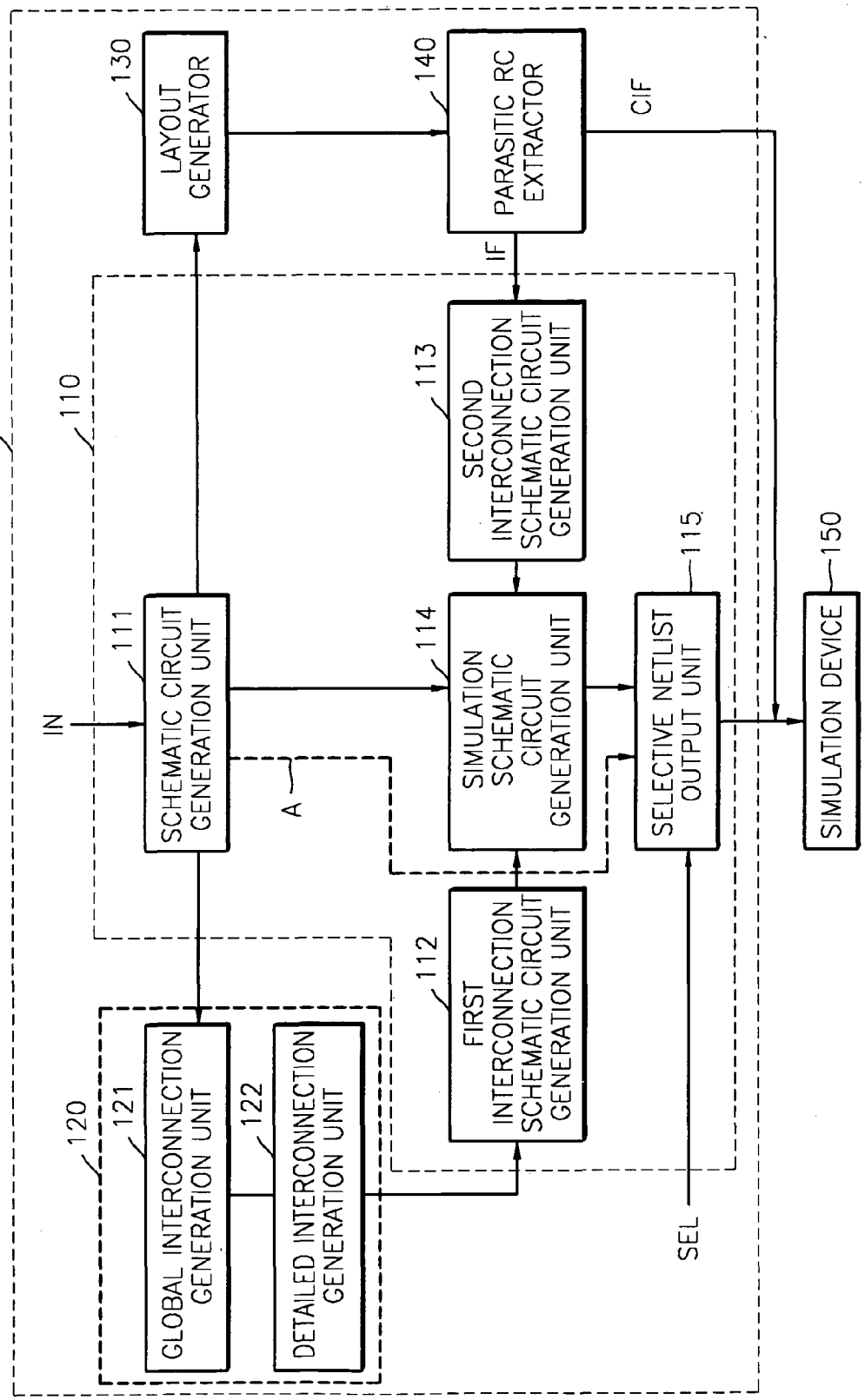
FIG. 1 is a block diagram illustrating a selective netlist generation device according to an embodiment of the present invention.

The structure and operation of each embodiment of a selective netlist generation device according to the present invention and a method according to the present invention for each embodiment of the selective netlist generation device will be described more fully with reference to the accompanying drawings, in which preferred embodiments of the invention are shown. The same reference numerals in different drawings represent the same element. The operations described hereinbelow may be performed by an entirely hardware embodiment, an entirely software embodiment or an embodiment combining software and hardware aspects. Moreover, embodiments of the invention may take the form of a computer program product on a computer-readable storage medium having computer-readable program code means embodied in the medium. Any suitable computer-readable medium may be utilized including hard disks, CD-ROMs or other optical or magnetic storage devices.

FIG. 1 is a block diagram illustrating a selective netlist generation device 100 according to a first preferred embodiment of the present invention. Referring to FIG. 1, the selective netlist generation device 100 comprises a selective netlist processor 110, an interconnection generator 120, a layout generator 130, and a parasitic RC extractor 140. The selective netlist processor 110 comprises a schematic circuit generation unit 111, a first interconnection schematic circuit generation unit 112, a second interconnection schematic circuit generation unit 113, a simulation circuit generation unit 114, and a selective netlist output unit 115. Here, the selective netlist processor 110 may be referred to as a schematic tool. The interconnection generator 120 comprises a global interconnection generation unit 121 and a detailed interconnection generation unit 122, and the layout generator 130 can be referred to as a layout tool.

The schematic circuit generation unit 111 receives input information IN and generates a schematic circuit. Here, the input information IN includes information on circuit devices included in respective cells of the schematic circuit, information on connections between the circuit devices, and schematic layout information of the cells. Each of the cells includes a plurality of circuit devices connected with each other and performing specific functions. For example, each cell may include a single inverter.

Meanwhile, the information on the schematic circuit generated from the schematic circuit generation unit 111 may be provided to a selective netlist output unit 115 along the path "A" illustrated in FIG. 1. Then, the selective netlist output unit 115 selects a specific cell of the schematic circuit in response to the selection information SEL, outputs the netlist of the selected cell, and provides the output netlist to a simulation device 150.

The interconnection generator 120, which is used in a pre-layout design step of a semiconductor integrated circuit design process, receives positional information of the respective cells included in the schematic circuit generated from the schematic circuit generation unit 111 and generates interconnections interconnecting the cells. The interconnection generator 120 may include only the global interconnection generation unit 121 or both the global interconnection generation unit 121 and the detailed interconnection generation unit 122.

The global interconnection generation unit 121 receives the positional information of the respective cells from the schematic circuit generation unit 111 and schematically generates interconnections interconnecting the cells based on the received positional information of the cells. The global interconnections may not include information on the types or widths of the interconnections. The global interconnections are preferably connected between the cells by way of the shortest path possible.

The detailed interconnection generation unit 122 receives information on the global interconnections from the global interconnection generation unit 121 and generates the detailed interconnections based on the received information on the global interconnections. The detailed interconnections include information on the types, widths, and lengths of the interconnections.

The first interconnection schematic circuit generation unit 112 receives the information on the detailed interconnections from the detailed interconnection generation unit 122 and generates a schematic circuit including parasitic resistance and parasitic capacitance based on the received information on the detailed interconnections.

The layout generator 130, which is used in a post-layout design step of a semiconductor integrated circuit design process, receives information on the schematic circuit generated from the schematic circuit generation unit 111 and generates a layout of the semiconductor integrated circuit.

The parasitic RC extractor 140 extracts a netlist CIF including parasitic resistance and parasitic capacitance, which are parasitic on the layout of the interconnection in the cell, as a file, from the layout of the cell generated from the layout generator 130, and extracts a netlist IF including parasitic resistance and parasitic capacitance, which are parasitic on the layout of the interconnection, as a file, from the layout of the interconnection.

The second interconnection schematic circuit generation unit 113 receives the file IF of the netlist from the parasitic RC extractor 140 and generates a schematic circuit of the interconnections including the parasitic resistance and parasitic capacitance based on the received file.

The simulation schematic circuit generation unit 114 receives information on the schematic circuit including first ports of the cells from the schematic circuit generation unit 111, and receives information on the schematic circuit including second ports connected to the parasitic resistance and parasitic capacitance, corresponding to the first ports, from the first interconnection schematic circuit generation unit 112. Then, the simulation schematic circuit generation unit 114 combines the respectively corresponding ports of the received two pieces of information so as to generate and store a first simulation schematic circuit for the simulation. Accordingly, as the simulation schematic circuit including interconnection influence is generated by the simulation schematic circuit generation unit 114, it is easy for the designer to insert various simulation options (e.g., a control card) into the generated simulation schematic circuit.

Also, the simulation schematic circuit generation unit 114 receives from the schematic circuit generation unit 111 information on the schematic circuit including first ports of the cells and receives from the second interconnection schematic circuit generation unit 113 information on the schematic circuit including second ports connected to the parasitic resistance and parasitic capacitance, corresponding to the first ports. Next, the simulation schematic circuit generation unit 114 combines the respective corresponding ports of the received two pieces of information so as to generate the second simulation schematic circuit for the simulation, and then replaces the stored first simulation schematic circuit with the second simulation schematic circuit.

The selective netlist output unit 115 receives selection information SEL and the information on the replaced second simulation schematic information, selects cells performing specific operations of a semiconductor integrated circuit (e.g., a read operation of a semiconductor memory device), and outputs the netlist of the selected cells as a file. Here, the selection information SEL is input by the designer of the semiconductor integrated circuit. Meanwhile, the output selective netlist may be combined with the netlist CIF of the layout in the cell, which is extracted from the layout of the selected cells by the parasitic RC extractor 140, such that the type and order of the output selective netlist are identical to those of the netlist CIF, and then be provided to a simulation device 150. As the combined selective netlist includes the netlist CIF of the layout in the cell, the simulation can be performed more accurately.

The simulation device 150 receives the selective netlist from the selective netlist output unit 115 or receives the combined selective netlist, and simulates a specific operation of the semiconductor integrated circuit based on the received selective netlist. Accordingly, since the selective netlist generation device 100 according to the first preferred embodiment of the present invention generates the selective netlist including interconnection influence, which is required to simulate only a specific part of the semiconductor integrated circuit, an accurate simulation can be carried out in pre-layout and post-layout steps, and the time required for the simulation can be remarkably reduced.

Figure 2:
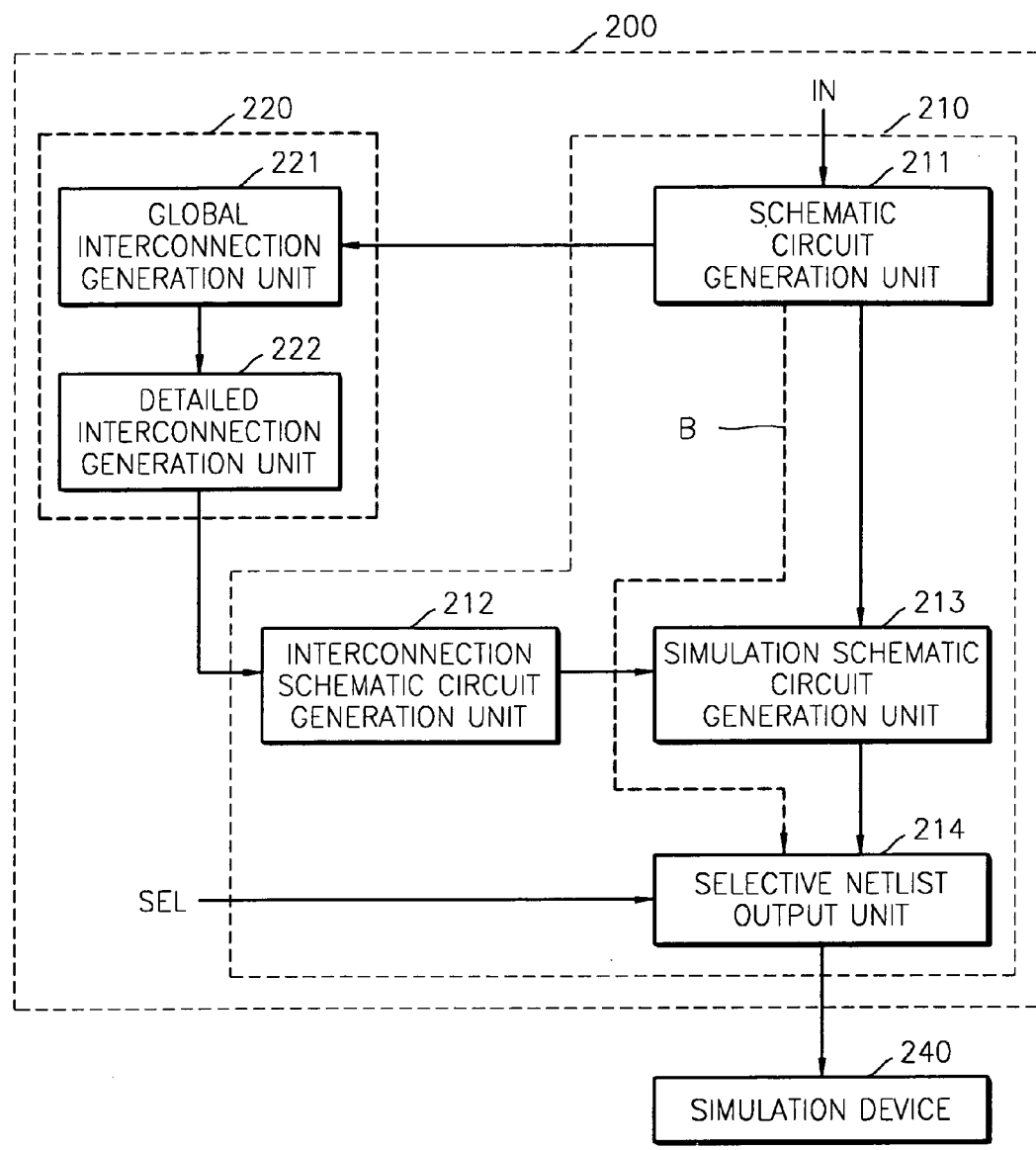
FIG. 2 is a block diagram illustrating a selective netlist generation device according to an embodiment of the present invention.

FIG. 2 is a block diagram illustrating a selective netlist generation device 200 according to another second preferred embodiment of the present invention. Referring to FIG. 2, the selective netlist generation device 200 comprises a selective netlist processor 210 and an interconnection generator 220. The selective netlist processor 210 comprises a schematic circuit generation unit 211, an interconnection schematic circuit generation unit 212, a simulation schematic circuit generation unit 213, and a selective netlist output unit 214, and the selective netlist processor 210 can be referred to as a schematic tool.

The schematic circuit generation unit 211 receives input information IN and generates a schematic circuit. Here, the input information IN includes information on circuit devices included in respective cells of the schematic circuit, information on connections between the circuit devices, and schematic layout information of the cells. Each of the cells includes a plurality of circuit devices connected with each other and performing specific functions. For example, each cell may include one or more logic gates.

Meanwhile, the information on the schematic circuit generated from the schematic circuit generation unit 211 may be provided to a selective netlist output unit 214 along the path "B" illustrated in FIG. 2. Then, the selective netlist output unit 214 selects a specific cell (or plurality of cells) on the schematic circuit in response to the selection information SEL, outputs the netlist of the selected cell(s), and provides the output netlist to a simulation device 240.

The interconnection generator 220, which is used in a pre-layout step of a semiconductor integrated circuit, receives positional information of the respective cells included in the schematic circuit generated from the schematic circuit generation unit 211 and generates interconnections interconnecting the cells. The interconnection generator 220 may include only the global interconnection generation unit 221, or both the global interconnection generation unit 221 and the detailed interconnection generation unit 222 as illustrated in FIG. 2.

The global interconnection generation unit 221 receives the positional information of the respective cells from the schematic circuit generation unit 211 and schematically generates interconnections interconnecting the cells based on the received positional information of the cells. The global interconnections do not include information on the types or widths of the interconnections. The global interconnections are preferably connected between the cells by way of the shortest path possible.

The detailed interconnection generation unit 222 receives information on the global interconnections from the global interconnection generation unit 221 and generates the detailed interconnections based on the received information on the global interconnections. The detailed interconnections include the information on the types, widths, and lengths of the interconnections.

The interconnection schematic circuit generation unit 212 receives the information on the detailed interconnections from the detailed interconnection generation unit 222 and generates a schematic circuit including parasitic resistance and parasitic capacitance based on the received information on the detailed interconnections.

The simulation schematic circuit generation unit 213 receives from the schematic circuit generation unit 211 information on the schematic circuit including first ports of the cells, and receives from the first interconnection schematic circuit generation unit 112 information on the schematic circuit including second ports connected to the parasitic resistance and parasitic capacitance, corresponding to the first ports. Then, the simulation schematic circuit generation unit 213 combines the respective corresponding ports of the received two pieces of information so as to generate and store a first simulation schematic circuit for the simulation. Accordingly, as the simulation schematic circuit including interconnection influence is generated by the simulation schematic circuit generation unit 213, it is easy for the designer to insert various simulation options (e.g., a control card) into the generated simulation schematic circuit.

The selective netlist output unit 214 receives selection information SEL and the information on the replaced second simulation schematic information, selects cells performing specific operations of a semiconductor integrated circuit (e.g., a read operation of a semiconductor memory device), and outputs the netlist of the selected cells as a file. Here, the selection information SEL may be input by the designer of the semiconductor integrated circuit.

The simulation device 240 receives the selective netlist from the selective netlist output unit 214 and simulates a specific operation of the semiconductor integrated circuit based on the received selective netlist. Accordingly, since the selective netlist generation device 200 according to an embodiment of the present invention generates the selective netlist including interconnection influence, which is required to simulate only a specific part of the semiconductor integrated circuit, an accurate simulation can be carried out in a pre-layout step, and the time required for the simulation can be reduced.

Figure 3:
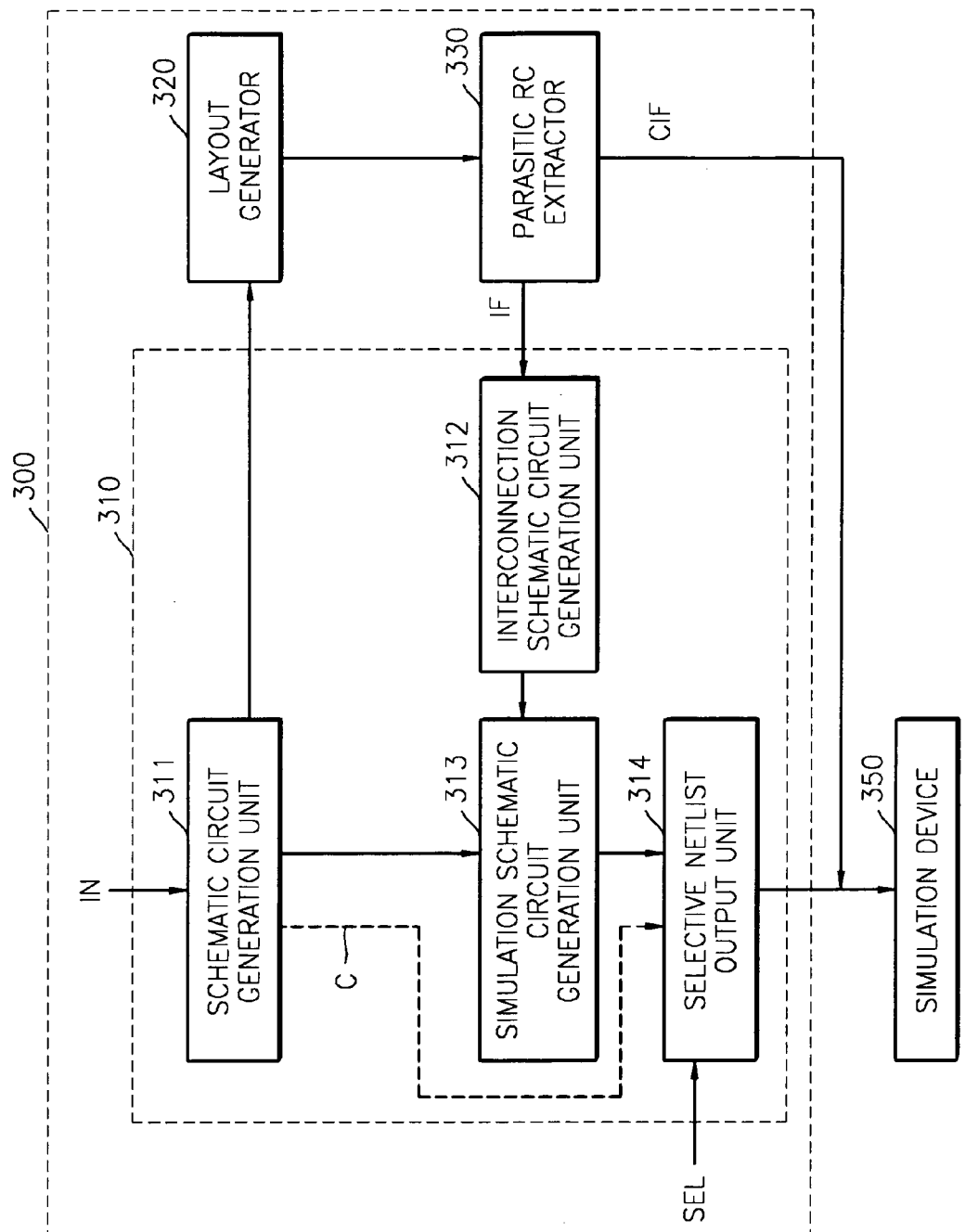
FIG. 3 is a block diagram illustrating a selective netlist generation device according to an embodiment of the present invention.

FIG. 3 is a block diagram illustrating a selective netlist generation device 300 according to another embodiment of the present invention. Referring to FIG. 3, the selective netlist generation device 300 comprises a selective netlist processor 310, a layout generator 320, and a parasitic RC extractor 330. The selective netlist processor 310 comprises a schematic circuit generation unit 311, an interconnection schematic circuit generation unit 312, a simulation schematic circuit generation unit 313, and a selective netlist output unit 314, and the selective netlist processor 310 can be referred to as a schematic tool.

The schematic circuit generation unit 311 receives input information IN and generates a schematic circuit. Here, the input information IN includes information on circuit devices included in respective cells of the schematic circuit, information on connections between the circuit devices, and schematic layout information of the cells. Each of the cells includes one or more circuit devices (e.g., logic gates) connected with each other and performing specific functions.

Meanwhile, the information on the schematic circuit generated from the schematic circuit generation unit 311 may be provided to a selective netlist output unit 314 along the path "C" illustrated in FIG. 3. Then, the selective netlist output unit 314 selects a specific cell on the schematic circuit in response to selection information SEL, outputs the netlist of the selected cell, and provides the output netlist to a simulation device 350.

The layout generator 320, which is used in a post-layout step of a semiconductor integrated circuit, receives positional information of the respective cells included in the schematic circuit generated from the schematic circuit generation unit 311 and generates interconnections interconnecting the cells. The layout generator 320 may be referred to as a layout tool.

The parasitic RC extractor 330 extracts a netlist CIF (cell interconnection file) including parasitic resistance and parasitic capacitance from the layout of the interconnection in the cell, from the layout of the cell generated from the layout generator 320. The extractor 330 also extracts a netlist IF (interconnection file) including parasitic resistance and parasitic capacitance from the layout of the interconnection.

The interconnection schematic circuit generation unit 312 receives the file IF of the netlist from the parasitic RC extractor 330 and generates a schematic circuit of the interconnections including the parasitic resistance and parasitic capacitance based on the received file.

The simulation schematic circuit generation unit 313 receives from the schematic circuit generation unit 311 information on the schematic circuit including first ports of the cells, and receives from the interconnection schematic circuit generation unit 312 information on the schematic circuit including second ports connected to the parasitic resistance and parasitic capacitance, corresponding to the first ports. Then, the simulation schematic circuit generation unit 313 combines the respective corresponding ports of the received two pieces of information so as to generate and store a first simulation schematic circuit for the simulation. Accordingly, as the simulation schematic circuit including interconnection influence is generated by the simulation schematic circuit generation unit 313, it is easy for the designer to insert various simulation options (e.g., a control card) into the generated simulation schematic circuit.

The selective netlist output unit 314 receives selection information SEL and the information on the replaced second simulation schematic information, selects cells performing specific operations of a semiconductor integrated circuit (e.g., a read operation of a semiconductor memory device), and outputs the netlist of the selected cells as a file. Here, the selection information SEL may be input by the designer of the semiconductor integrated circuit.

Meanwhile, the output selective netlist may be combined with the netlist CIF of the layout in the cell, which is extracted from the layout of the selected cells by the parasitic RC extractor 330, such that the type and order of the output selective netlist are identical to those of the netlist CIF, and then provided to a simulation device 350. As the combined selective netlist includes the netlist CIF of the layout in the cell, the simulation can be performed more accurately.

The simulation device 350 receives the selective netlist from the selective netlist output unit 314 or the combined selective netlist, and simulates a specific operation of the semiconductor integrated circuit based on the received selective netlist. Accordingly, since the selective netlist generation device 300 according to the third preferred embodiment of the present invention generates the selective netlist including interconnection influence, which is required to simulate only a specific part of the semiconductor integrated circuit, the accurate simulation can be carried out in a post-layout step, and the time required for the simulation can be reduced.

Figure 4A:
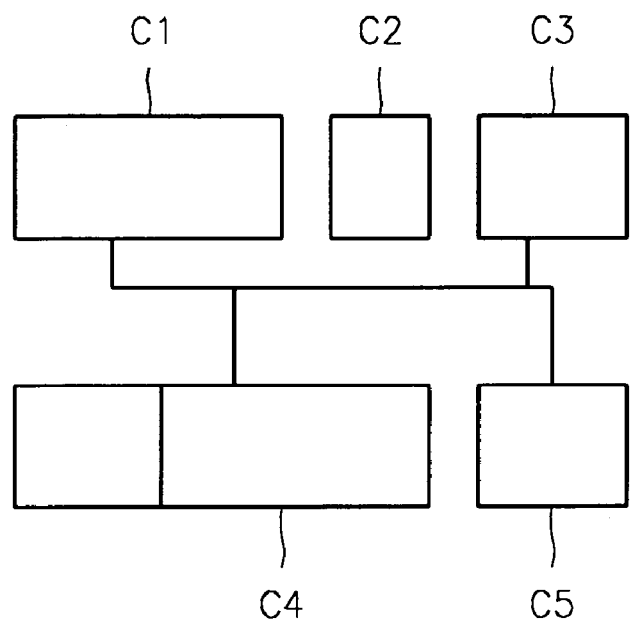
FIG. 4A is a diagram illustrating an example of global interconnections generated by a global interconnection generation unit of FIG. 1 or a global interconnection generation unit of FIG. 2.

FIG. 4A is a diagram illustrating an example of global interconnections generated by the global interconnection generation unit 121 of FIG. 1 or the global interconnection generation unit 221 of FIG. 2. Referring to FIG. 4A, reference numerals C1, C2, C3, C4, and C5 represent cells. The cells C1, C2, C3, C4, and C5 are connected to each other, thereby constituting the global interconnections. The global interconnections typically do not include information on the types or widths of the interconnections.

Figure 4B:
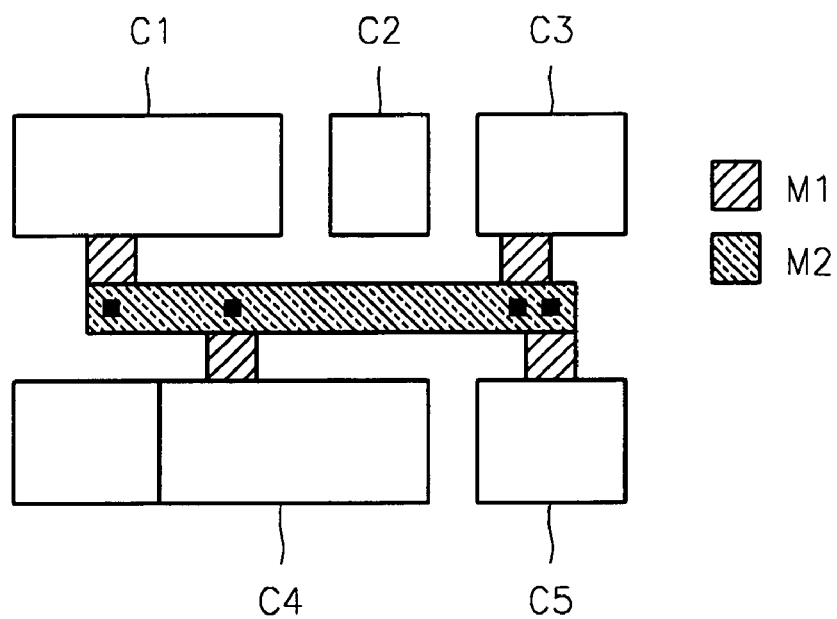
FIG. 4B is a diagram illustrating an example of detailed interconnections corresponding to the global interconnections of FIG. 4A.

FIG. 4B is a diagram illustrating an example of detailed interconnections corresponding to the global interconnections of FIG. 4A. Referring to FIG. 4B, reference numerals C1, C2, C3, C4, and C5 represents cells, and reference numerals M1 and M2 represent metal layers. The cells C1, C2, C3, C4, and C5 are connected to each other via the respective metal layers M1 and M2, thereby constituting the detailed interconnections. The detailed interconnections may include information on the types, widths, and lengths of the interconnections.

Figure 5A:
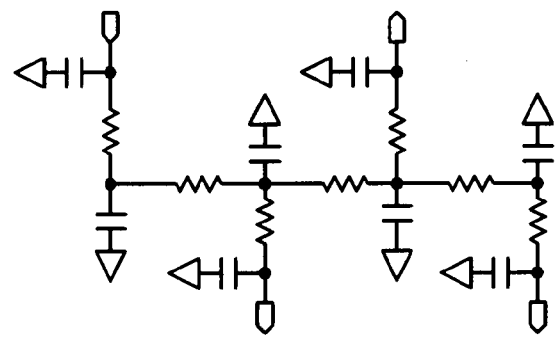
FIG. 5A is a diagram illustrating a schematic circuit of the interconnections including parasitic resistance and parasitic capacitance, corresponding to the detailed interconnections of FIG. 4B.

FIG. 5A is a diagram illustrating a schematic circuit of the interconnection including parasitic resistance and parasitic capacitance, corresponding to the detailed interconnections of FIG. 4B. Referring to FIG. 5A, the schematic circuit of the interconnection including the parasitic resistance and parasitic capacitance is generated by the first interconnection schematic circuit generation unit 121 of FIG. 1 or the interconnection schematic circuit generation unit 221 of FIG. 2. Also, the schematic circuit of the interconnection including the parasitic resistance and parasitic capacitance is generated in a state that the ports of the respective cells maintain their original topology.

Figure 5B:
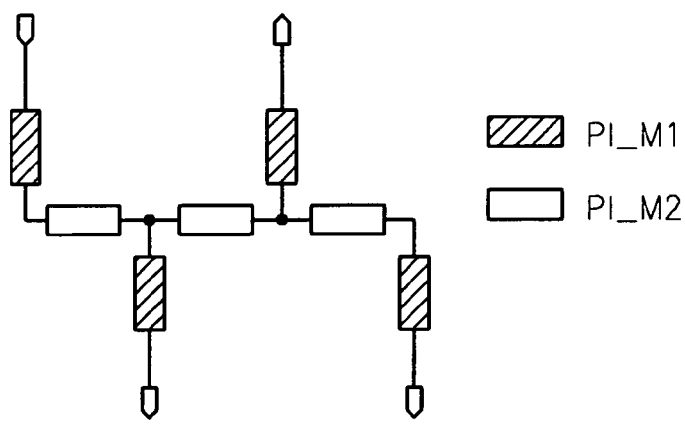
FIG. 5B is a diagram illustrating a schematic circuit of the interconnections having a hybrid π model corresponding to the schematic circuit of FIG. 5A.
Figure 5C:
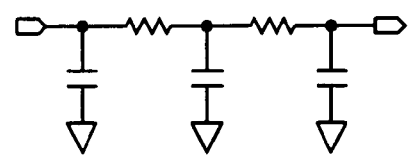
FIG. 5C is a diagram illustrating the inside of the hybrid π model of FIG. 5B.

FIG. 5B is a diagram illustrating a schematic circuit of the interconnections having a hybrid π model, corresponding to the schematic circuit of FIG. 5A. Referring to FIG. 5B, PI_M1 and PI_M2 represent respectively different hybrid π models, which are designated by a designer. The schematic circuit having the hybrid π model also is generated in a state that the ports of the respective cells maintain their original topology. FIG. 5C is a diagram illustrating the inside of the hybrid π model (PI_M2) of FIG. 5B.

Figures 6A, 6B:
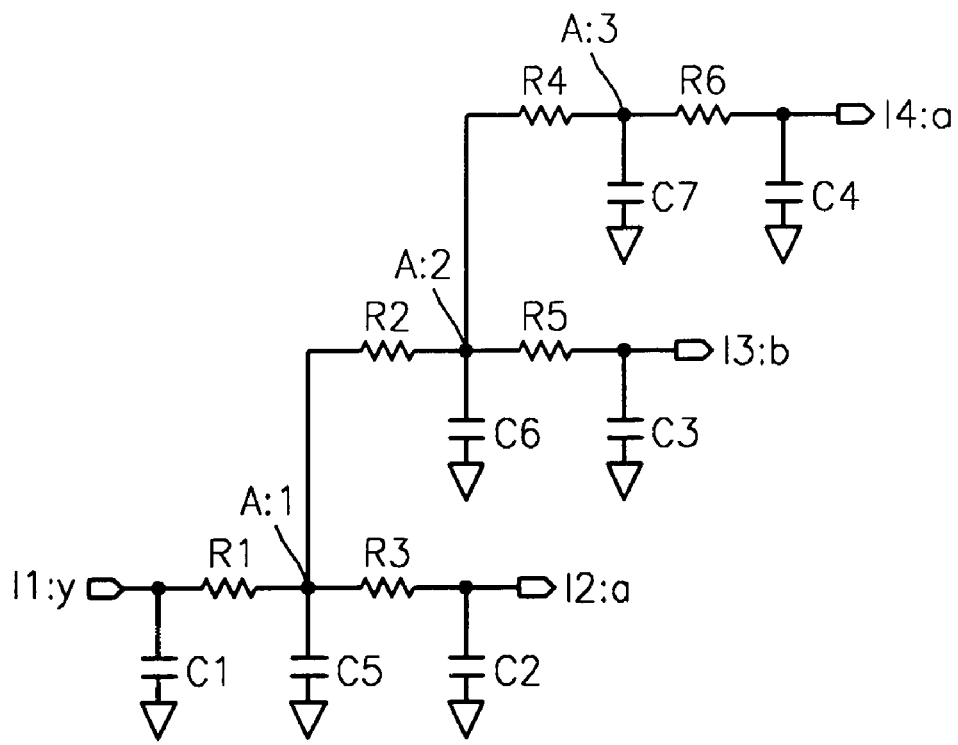
FIG. 6A is a diagram illustrating an example of a SPICE netlist extractable from a parasitic RC extractor of FIG. 1 or a parasitic RC extractor of FIG. 3.
FIG. 6B is a diagram illustrating a tree-structural interconnection schematic circuit including parasitic resistance and parasitic capacitance, corresponding to FIG. 6A.

FIG. 6A is a diagram illustrating an example of a SPICE netlist extractable from the parasitic RC extractor 140 of FIG. 1 or the parasitic RC extractor 330 of FIG. 3. Referring to FIG. 6A, each of reference numerals 11, 12, 13, and 14 is indicative of the name of an instance corresponding to the cell of the schematic circuit. For example, the first line of the SPICE netlist, i.e., R1 I1:y A:1 10, indicates that the first resistance R1 having the resistance of 10 is positioned between a port y of the first instance I1 and a node 1 of a net A. The remaining lines are written according to this method.

FIG. 6B is a diagram illustrating a tree-structural interconnection schematic circuit including parasitic resistance and parasitic capacitance, corresponding to FIG. 6A. Referring to FIG. 6B, the tree-structural schematic circuit including the parasitic resistance and parasitic capacitance is generated from the second interconnection schematic circuit generation unit 113 of FIG. 1 or the interconnection schematic circuit generation unit 312 of FIG. 3. The unit can predict an RC delay of a signal transmitted from a drive terminal (I1:y) to an output terminal (14:a), from the tree-structural schematic circuit of the interconnections including the parasitic resistance and parasitic capacitance.

Figure 7A:
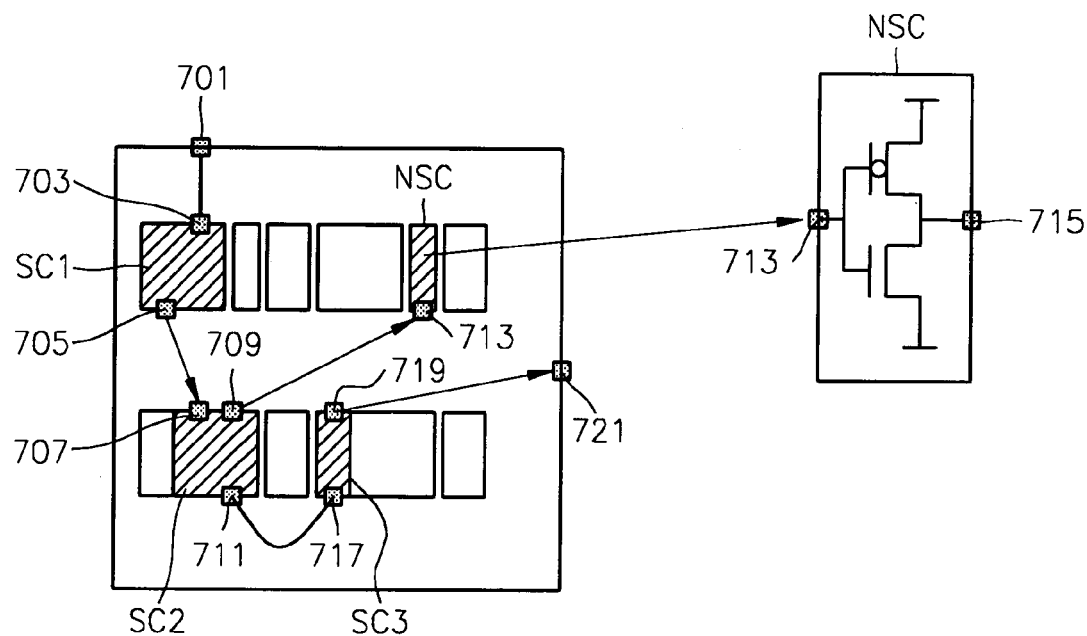
FIG. 7A is a diagram illustrating an example of a selective simulation schematic circuit generated by the selective netlist output unit of FIG. 1, 2, or 3.
Figure 7B:
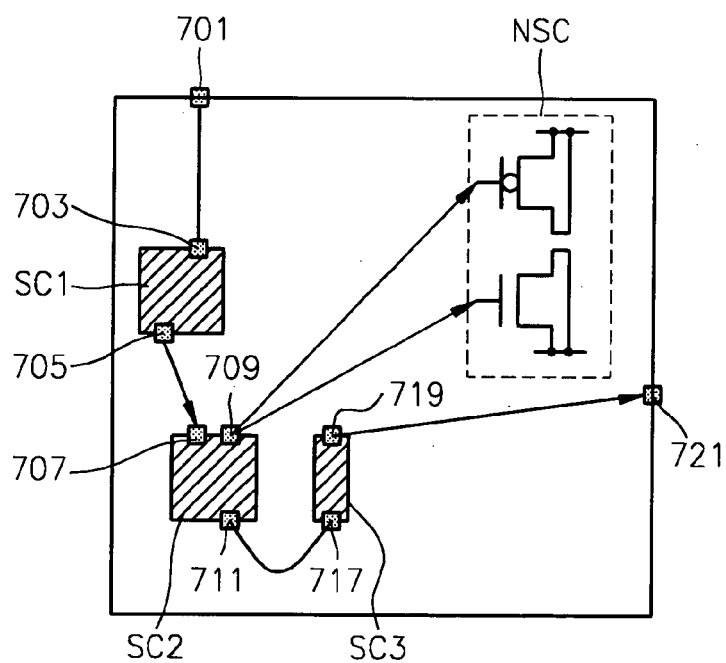
FIG. 7B is a diagram illustrating an example of the selective simulation schematic circuit including selected cells corresponding to FIG. 7A.

FIG. 7A is a diagram illustrating an example of a selective simulation schematic circuit generated by the selective netlist output unit of FIG. 1, 2, or 3, and FIG. 7B is a diagram illustrating an example of the selective simulation schematic circuit including selected cells corresponding to FIG. 7A. Referring to FIGS. 7A and 7B, SC1, SC2, and SC3 are indicative of cells selected by the designer in order to perform specific operations of the semiconductor integrated circuit (e.g., a read operation of a semiconductor memory device), and a non-selected cell NSC may include an inverter. An input port 701, an input port 703, and an output port 705 of a first selection cell SC1, an input port 707 and output ports 709 and 711 of a second selection cell SC2, an input port 717 and an output port 719 of a third selection cell SC3, an input port 713 of the non-selected cell NSC, and an output port 721 are connected to each other, thereby constituting a critical path, which will be simulated by the designer. However, since an output port 715 of the non-selected cell NSC is not included in the critical path, a MOS transistor, in which a source and a drain are combined, can be generated as illustrated in FIG. 7A. Accordingly, like the MOS transistor, delay factors are reflected to perform an accurate simulation. The input port and output port may be referred to as an input pin and output pin, respectively.

Figure 8:
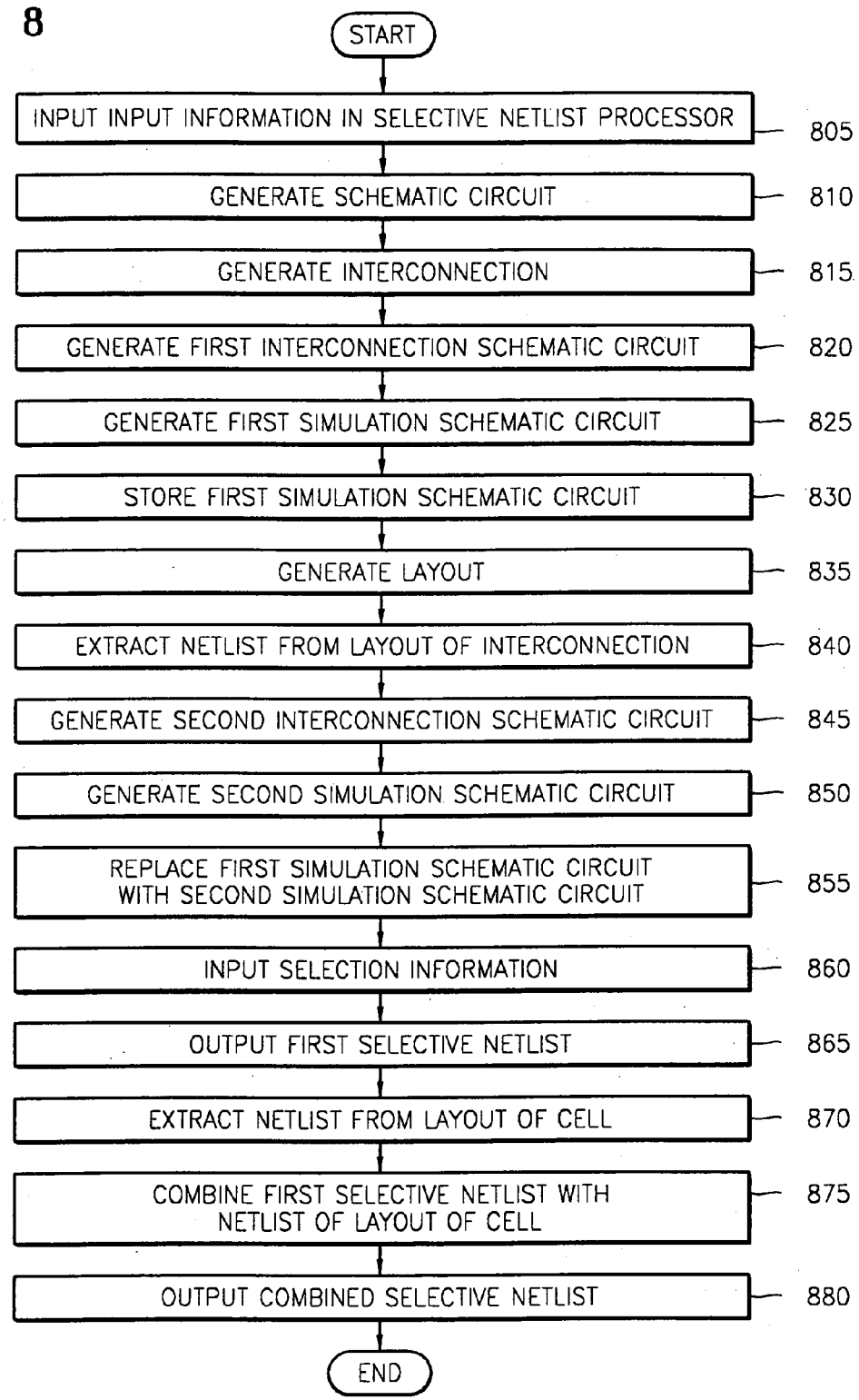
FIG. 8 is a flowchart illustrating a method for generating a selective netlist according to an embodiment of the present invention.

Operations for various aspects of the present invention are illustrated in detail in FIGS. 8–10, which are flowchart illustrations. It will be understood that each block of the flowchart illustrations, and combinations of blocks in the flowchart illustrations, can be implemented by computer program instructions. These computer program instructions may be provided to a processor or other programmable data processing apparatus to produce a machine, such that the instructions, which execute on the processor or other programmable data processing apparatus create means for implementing the functions specified in the flowchart block or blocks. These computer program instructions may also be stored in a computer-readable memory that can direct a processor or other programmable data processing apparatus to function in a particular manner, such that the instructions stored in the computer-readable memory produce an article of manufacture including instruction means which implement the functions specified in the flowchart block or blocks.

FIG. 8 is a flowchart illustrating a method for generating a selective netlist according to an embodiment of the present invention. In step 805, input information is input in the selective netlist processor. Here, the input information includes information on circuit devices included in respective cells of the schematic circuit, information on connections between the circuit devices, and schematic layout information of the cells. Each of the cells includes a plurality of circuit devices connected with each other and performing specific functions. In step 810, the schematic circuit generation unit included in the selective netlist processor generates a schematic circuit in response to the input information. In step 815, the interconnection generator receives positional information of cells included in the generated schematic circuit and generates interconnections interconnecting the cells. In step 820, the first interconnection schematic circuit generation unit receives the information on the interconnections and generates a schematic circuit of the interconnections including parasitic resistance and parasitic capacitance, which are parasitic on the interconnections. In step 825, the simulation schematic circuit generation unit combines first ports of the schematic circuit with second ports of the schematic circuit of the interconnections generated from the first interconnection schematic circuit generation unit, corresponding to the first ports, thereby generating a first simulation schematic circuit. In step 830, the simulation schematic circuit generation unit stores the first simulation schematic circuit. In step 835, the layout generator receives the information of the generated schematic circuit and generates a layout of a semiconductor integrated circuit. In step 840, the parasitic RC extractor extracts netlist including parasitic resistance and parasitic capacitance from the layout of the interconnections. In step 845, the second interconnection schematic circuit generation unit receives the netlist extracted from the layout of the interconnection and generates a schematic circuit of the interconnections including the parasitic resistance and parasitic capacitance. In step 850, the simulation schematic circuit generation unit combines first ports of the schematic circuit with second ports of the schematic circuit of the interconnections generated from the second interconnection schematic circuit generation unit, corresponding to the first ports. In step 855, the simulation schematic circuit generation unit replaces the stored first simulation schematic circuit with the second simulation schematic circuit and stores the replaced second simulation schematic circuit. In step 860, the designer inputs selection information to the selective netlist output unit. The selection information selects cells performing specific operations among the cells included in the second simulation schematic circuit. In step 865, the selective netlist output unit outputs a first selective netlist on the cells performing the specific operations, in response to the selection information. Although not shown in the drawing, the first selection information may be provided to a simulation device. In step 870, the parasitic RC extractor receives layout information of the cell from the layout generator and extracts the netlist on the layout of the cell. In step 875, the first selective netlist and the layout of the cell are combined such that the type and order of the first selective netlist are identical with those of the layout of the cell. In step 880, the combined selection information is output and provided to the simulation device.

FIG. 9 is a flowchart illustrating a method for generating a selective netlist according to another embodiment of the present invention. In step 905, input information is input in the selective netlist processor. Here, the input information includes information on circuit devices included in respective cells of the schematic circuit, information on connections between the circuit devices, and schematic layout information of the cells. Each of the cells includes a plurality of circuit devices connected with each other and performing specific functions. In step 910, the schematic circuit generation unit included in the selective netlist processor generates a schematic circuit in response to the input information. In step 915, the global interconnection generation unit schematically generates interconnections interconnecting cells included in the schematic circuit in a pre-layout step. The global interconnections typically do not include information on the types and widths of the interconnections. The global interconnections are preferably connected between the cells by way of the shortest path as possible. In step 920, the detailed interconnection generation unit generates detailed interconnections corresponding to the global interconnections. The detailed interconnections typically include information on the types, widths, and lengths of the interconnections. In step 925, the interconnection schematic circuit generation unit generates a schematic circuit of the interconnections including parasitic resistance and parasitic capacitance, corresponding to the detailed interconnections. In step 930, the simulation schematic circuit generation unit combines first ports of the schematic circuit with second ports of the schematic circuit of the interconnections generated from the interconnection schematic circuit generation unit, corresponding to the first ports, thereby generating a simulation schematic circuit. In step 935, the designer inputs selection information in the selective netlist output unit. The selection information selects cells performing specific operations (e.g., a read operation of a semiconductor memory device) among the cells included in the simulation schematic circuit. In step 940, the selective netlist output unit outputs a selective netlist on the cells performing the specific operations, in response to the selection information.

FIG. 10 is a flowchart illustrating a method for generating a selective netlist according to another embodiment of the present invention. In step 1005, input information is input in the selective netlist processor. Here, the input information includes information on circuit devices included in respective cells of the schematic circuit, information on connections between the circuit devices, and schematic layout information of the cells. Each of the cells includes a plurality of circuit devices connected with each other and performing specific functions. In step 1010, the schematic circuit generation unit included in the selective netlist processor generates a schematic circuit in response to the input information. In step 1015, the layout generator receives the information on the generated schematic circuit and generates a layout based on the received information on the schematic circuit. In step 1020, the parasitic RC extractor extracts a netlist including parasitic resistance and parasitic capacitance from the layout of the interconnections. In step 1025, the interconnection schematic circuit generation unit receives the netlist extracted from the layout of the interconnection and generates a schematic circuit of the interconnections including the parasitic resistance and parasitic capacitance. In step 1030, the simulation schematic circuit generation unit combines first ports of the schematic circuit with second ports of the schematic circuit of the interconnections generated from the interconnection schematic circuit generation unit, corresponding to the first ports. In step 1035, the designer inputs selection information in the selective netlist output unit. The selection information selects cells performing specific operations among the cells included in the simulation schematic circuit. In step 1040, the selective netlist output unit outputs a selective netlist on the cells performing the specific operations, in response to the selection information.

Accordingly, as described hereinabove, operations for generating an integrated circuit netlist according to embodiments of the present invention include generating a first schematic of an integrated circuit having a plurality of cells therein (Block 111) and generating a second schematic that defines pre-layout electrical interconnects between the plurality of cells of the integrated circuit and approximates parasitic resistances and parasitic capacitances of the pre-layout interconnects (Block 112). As described above with respect to Block 114 in FIG. 1, the first and second schematics are combined at corresponding first and second ports within the first and second schematics, respectively. Further embodiments of the present invention are configured to generate an integrated circuit netlist by generating a circuit schematic that defines post-layout electrical interconnects between the plurality of cells of the integrated circuit and approximates parasitic resistances and parasitic capacitances of the post-layout interconnects (Block 113). This circuit schematic is then combined with the first schematic at corresponding first and second ports therein (Block 114). These embodiments may also be configured to generate a layout schematic from the first schematic of the integrated circuit (Block 130) and generate parasitic resistances and capacitances of the post-layout interconnects that extend between a plurality of cells in the layout schematic (Block 140, IF). Operations are then performed to generate parasitic resistances and capacitances of interconnects internal to at least one cell in the layout schematic (Block 140, CIF).

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of generating an integrated circuit netlist, comprising the steps of:
    generating a first schematic of an integrated circuit having a plurality of cells therein;
    generating a second schematic that defines post-layout electrical interconnects between the plurality of cells of the integrated circuit and approximates parasitic resistances and parasitic capacitances of the post-layout interconnects; and
    combining the first and second schematics at corresponding first and second ports within the first and second schematics, respectively.

2. The method of claim 1, wherein said step of generating a second schematic comprises the steps of:
    generating a layout schematic from the first schematic of the integrated circuit;
    generating parasitic resistances and capacitances of the post-layout interconnects that extend between a plurality of cells in the layout schematic; and
    generating parasitic resistances and capacitances of interconnects internal to at least one cell in the layout schematic.

3. The method of claim 2, wherein said step of combining the first and second schematics comprises combining the first and second schematics into a simulation schematic.

4. The method of claim 3, further comprising the steps of:
    generating a netlist of at least a portion of the simulation schematic; and
    supplementing the netlist with the parasitic resistances and capacitances of interconnects internal to the at least one cell in the layout schematic.

5. A computer program product that is configured to generate an integrated circuit netlist, comprising a computer-readable storage medium having computer-readable program code embodied in said medium, said computer-readable program code comprising:
    computer-readable program code that is configured to generate a first schematic of an integrated circuit having a plurality of cells therein;
    computer-readable program code that is configured to generate a second schematic that defines post-layout electrical interconnects between the plurality of cells of the integrated circuit and approximate parasitic resistances and parasitic capacitances of the post-layout interconnects; and
    computer-readable program code that is configured to combine the first and second schematics at corresponding first and second ports within the first and second schematics, respectively.

6. The product of claim 5, wherein said computer-readable program code that is configured to generate a second schematic comprises:
    computer-readable program code that is configured to generate a layout schematic from the first schematic of the integrated circuit;
    computer-readable program code that is configured to generate parasitic resistances and capacitances of the post-layout interconnects that extend between a plurality of cells in the layout schematic; and
    computer-readable program code that is configured to generate parasitic resistances and capacitances of interconnects internal to at least one cell in the layout schematic.

7. The product of claim 6, wherein said computer-readable program code that is configured to combine the first and second schematics comprise computer-readable program code that is configured to combine the first and second schematics into a simulation schematic.

8. The product of claim 7, further comprising:
    computer-readable program code that is configured to generate a netlist of at least a portion of the simulation schematic; and
    computer-readable program code that is configured to supplement the netlist with the parasitic resistances and capacitances of interconnects internal to the at least one cell in the layout schematic.

9. A method of generating an integrated circuit netlist, comprising the steps of:
    generating a first schematic of an integrated circuit having a plurality of cells therein;
    generating a second schematic that defines pre-layout electrical interconnects between the plurality of cells of the integrated circuit and approximates parasitic resistances and parasitic capacitances of the pre-layout interconnects; and
    combining the first and second schematics at corresponding first and second ports within the first and second schematics, respectively.

10. An integrated circuit netlist generation apparatus, comprising:
    means for generating a first schematic of an integrated circuit having a plurality of cells therein;
    means for generating a second schematic that defines pre-layout electrical interconnects between the plurality of cells of the integrated circuit and approximates parasitic resistances and parasitic capacitances of the pre-layout interconnects; and
    means for combining the first and second schematics at corresponding first and second ports within the first and second schematics, respectively.

* * * * *